United States Patent

Chillara et al.

[11] Patent Number: 5,569,956
[45] Date of Patent: Oct. 29, 1996

[54] INTERPOSER CONNECTING LEADFRAME AND INTEGRATED CIRCUIT

[75] Inventors: Satya N. Chillara, San Jose; Jaime A. Bayan, Palo Alto, both of Calif.

[73] Assignee: National Semiconductor Corporation, Santa Clara, Calif.

[21] Appl. No.: 521,618

[22] Filed: Aug. 31, 1995

[51] Int. Cl.$^6$ .............................. H01L 23/28; H01L 23/48
[52] U.S. Cl. ...................... 257/668; 257/673; 257/692; 257/737; 257/792; 257/779; 257/786
[58] Field of Search .................................. 257/668, 673, 257/687, 688, 692, 698, 702, 737, 738, 774, 773, 779, 780, 792, 690

[56] References Cited

U.S. PATENT DOCUMENTS

| | | | |
|---|---|---|---|
| 4,417,386 | 11/1983 | Exner | 257/759 |
| 5,018,005 | 5/1991 | Lin et al. | 257/692 |
| 5,182,631 | 1/1993 | Tomimuro et al. | 257/688 |
| 5,231,303 | 7/1993 | Kasahara et al. | 257/673 |
| 5,233,131 | 8/1993 | Liang et al. | 29/827 |
| 5,260,168 | 11/1993 | Vernon | 257/668 |
| 5,442,231 | 8/1995 | Miyamoto et al. | 257/690 |
| 5,457,340 | 10/1995 | Templeton, Jr. et al. | 257/690 |

*Primary Examiner*—Robert P. Limanek
*Assistant Examiner*—Alexander Oscar Williams
*Attorney, Agent, or Firm*—Skjerven, Morrill, MacPherson, Franklin & Friel, LLP; Brian D. Ogonowsky

[57] ABSTRACT

An interposer between the leads of a leadframe and the ends of wires connected to an integrated circuit die is described herein. The interposer may consist a polyimide tape or other insulating material with conductive traces formed thereon, each trace electrically connecting an inner bonding pad to an outer bonding pad formed on the tape. The outer bonding pads are generally arranged around the periphery of the interposer and are bonded to respective ends of the leadframe. An integrated circuit die is placed in approximately the center of the interposer surrounded by the inner bonding pads. An automatic bonder then bonds wires to the bonding pads on the die and to the inner bonding pads on the interposer. The die is now electrically connected to the leadframe via the traces on the interposer.

13 Claims, 3 Drawing Sheets

5,569,956

INTERPOSER CONNECTING LEADFRAME AND INTEGRATED CIRCUIT

FIELD OF THE INVENTION

This invention relates to integrated circuit packaging and, in particular, to a device which electrically connects a leadframe to terminals of an integrated circuit.

BACKGROUND OF THE INVENTION

The plastic package is the workhorse for most of the commercial semiconductor devices. The leadframe manufacturer's job becomes more complex as the lead count increases and the die size decreases. FIG. 1 is a top-down plan view of a single leadframe 10 prior to being separated from a leadframe strip. While on the strip, the leads 12 of leadframe 10 are shorted together for testing and for mechanical stability. These shorting connections are later removed once their function has been completed. Leadframe 10 is typically formed of a conductive copper (or copper alloy) material having a thickness in the range of generally 5–20 mils, depending upon the required ruggedness of the leads of the integrated circuit package.

FIG. 2 is a cross-sectional view across an integrated circuit package incorporating leadframe 10. As illustrated in FIG. 2, an integrated circuit die 14 having bonding pads thereon is centered with respect to leadframe 10, and thin wires 16 are connected between the bonding pads on the die and the ends of each lead 12 of the leadframe 10. The wires may be aluminum, gold, or any other known wiring material. The resulting structure is then encapsulated in a plastic package 18, and the protruding ends of the leadframe 10 are bent as appropriate for the particular application.

It is desirable to have short wires 16 between leads 12 and the die's bonding pads to limit wire sweep (i.e., lateral movement) during the plastic molding operation. With closely spaced leads 12, such wire sweeping may cause shorting together of adjacent wires 16. Minimizing the wire 16 length also reduces any mechanical forces on the wire bonds during wire sweeping.

As fabrication technologies make available submicron geometries, such as 0.35 micron line widths, the die size shrinks. Since the leadframe must have certain mechanical properties, the pitch of the leads is limited to about 8 mils (125 leads per inch), using conventional etching or stamping processes for forming the leadframes. Thus, with a small die having a large number of bonding pads with a pitch of significantly less than 8 mils, it is easily conceivable that the ends of the leadframe must terminate an undesirably large distance away from the die. This will require the wires extending between the die and the ends of the leadframe to be relatively long, giving rise to the wire sweeping problems already discussed.

One particular integrated circuit known to the applicants is approximately 0.350×0.350 square inches and requires 160 leads, with 40 leads per side. The resulting lead pitch is about 9 mils. If the die were smaller, the leadframe leads would terminate farther from the die, and wire sweeping problems may occur. Therefore, there is little incentive to make the chip smaller.

What is needed is a technique to avoid the above problems of wire sweeping so the die sizes can shrink and the number of bonding pads on a die can be relatively large.

SUMMARY

An interposer is described herein which is connected between the leads of a leadframe and the ends of wires, where the other ends of the wires are bonded to bonding pads on a die. The interposer may consist of a polyimide tape or other insulating material with conductive traces formed thereon, each trace electrically connecting an inner bonding pad formed on the tape to an outer bonding pad formed on the tape.

The outer bonding pads are generally arranged around the periphery of the interposer and are connected to respective ends of the leadframe using conductive solder balls or another suitable means, such as a Z-conductive adhesive.

An integrated circuit die is placed in approximately the center of the interposer surrounded by the inner bonding pads. An automatic bonder then bonds wires to the bonding pads on the die and to the inner bonding pads on the interposer. The die is now electrically connected to the leadframe via the traces on the interposer. Multiple dies can also be interconnected and connected to the leadframe using a single interposer.

The interposer allows wires to be shorter than wires which would ordinarily be used to connect the die's bonding pads to the leads of the leadframe. This limits wire sweep during the plastic molding process used to encapsulate the die. This structure and method also eases fabrication due to the ability to have larger lead tip pitches and, in many cases, simplifies the wire bonding process.

DETAILED DESCRIPTION OF THE PREFERRED EMBODIMENTS

Figure 3:
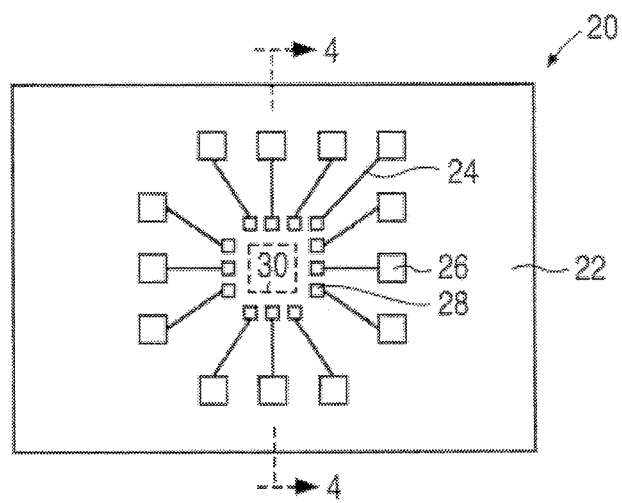
FIG. 3 is a top-down view of an interposer in accordance with one embodiment of the invention.

FIG. 3 is a top-down view of a simplified embodiment of the interposer 20, which provides an electrical interface between ends of a leadframe and wires bonded to bonding pads of an integrated circuit die. Interposer 20, in the preferred embodiment, is formed as a polyimide tape 22 along with identical interposers in a step-and-repeat type process and then separated out at the appropriate time during the package manufacturing process. In one embodiment, the polyimide tape 22 is approximately 2 mils thick, but could be any suitable thickness. In an alternative embodiment, the interposer is any other suitable insulating material, whether flexible or inflexible.

Conductive traces 24 are formed on tape 22 by conventional photolithographic and etching processes or by using a plating process. Traces 24 may be formed by any process conventionally used to form tape automated bonding (TAB) circuits and may be copper or a suitable copper alloy conventionally used for such traces. Traces 24 may take the form of any suitable type of conductor, depending on the particular application and depending on the insulating substrate used.

A set of outer bonding pads 26 terminate the outer ends of traces 24. The ends of a leadframe will ultimately be bonded to bonding pads 26. Bonding pads 26 may be formed of any material conventionally used for forming bonding pads, and the particular material used may depend on the intended method for bonding the leadframe ends to the bonding pads 26. Conventional materials used for bonding pads include copper alloys and gold.

A set of inner bonding pads 28 terminate the inner ends of traces 24. Bonding pads 28 will ultimately have wires bonded to them or directly contact terminal pads of a flip-chip or similar type chip. The distance between the outer bonding pads 26 and the inner bonding pads 28 will depend upon various factors, including the number of leads required, the minimum desired pitch of the lead tips, and the size of the die. The intended placement of the die is shown in dashed outline 30.

Figure 4:
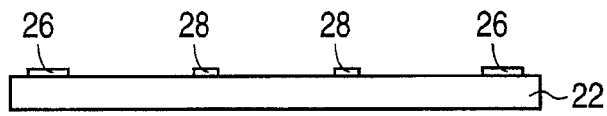
FIG. 4 is a cross-sectional view of the interposer of FIG. 3 across line 4—4 in FIG. 3.

FIG. 4 is a cross-sectional view of the interposer 20 along line 4—4 in FIG. 3, cutting across two outer bonding pads 26 and two inner bonding pads 28.

Figure 1:
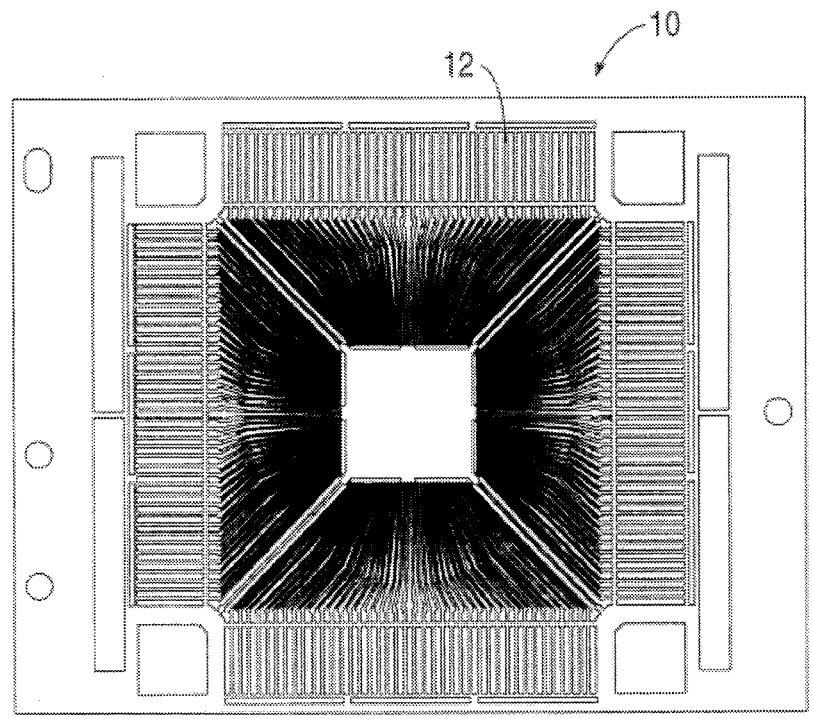
FIG. 1 is a top-down view of a conventional leadframe prior to being separated from a leadframe strip.
Figure 2:
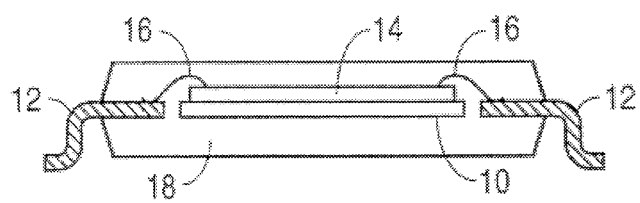
FIG. 2 is a cross-sectional view of a conventional integrated circuit package.
Figure 5:
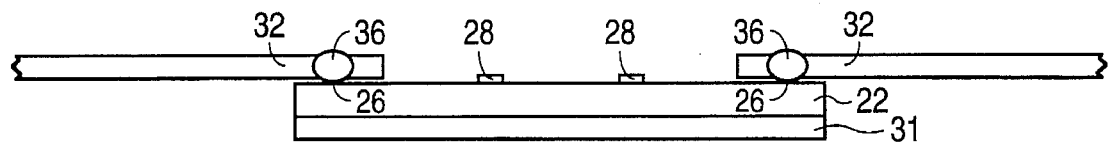
FIG. 5 shows the interposer of FIG. 4 having a heat spreader or mechanical support member affixed thereto and having ends of a leadframe bonded to the outer bonding pads of the interposer.

In FIG. 5, a heat spreader 31, which may also act as a mechanical support, is affixed to the bottom of tape 22 for heat dissipation and support by means of an adhesive. Such a head spreader 30 may be a metal. The leads 32 of a leadframe, such as leadframe 10 in FIG. 1, are then placed on tape 22 so that the leads 32 are aligned with their respective outer bonding pads 26.

In one embodiment, the ends of leads 32 have a hole formed in them to hold solder balls 36.

The bonding pads 26 and leads 32 are tacked together initially. If solder balls 36 are used, the structure is then heated using a convection furnace or other conventional means to reflow the solder balls 36 so that the leadframe is now electrically connected to bonding pads 26.

Alternatively, the leads 32 may be attached to bonding pads 26 using a Z-conductive adhesive, which primarily conducts in the vertical direction between the leads 32 and the underlying bonding pads 26. Any other suitable conductive adhesive or bonding process may be used.

The use of the Z-conductive adhesive prevents, or greatly attenuates, shorting between adjacent leads 32. In one embodiment of using a Z-conductive adhesive, the adhesive is placed around the perimeter of the tape 22 and over bonding pads 26 where the leadframe is to make contact. This provides a mechanical bond as well as an electrical bond between the bonding pads 26 and the overlying leadframe.

An alternative method is to place solder ball bumps on bonding pads 26 by means of a conventional wire bonder which uses a solder wire. After the leads 32 are aligned with the bonding pads 26, the solder bumps are then reflowed to electrically bond the leads 32 and bonding pads 26 together.

Figure 6:
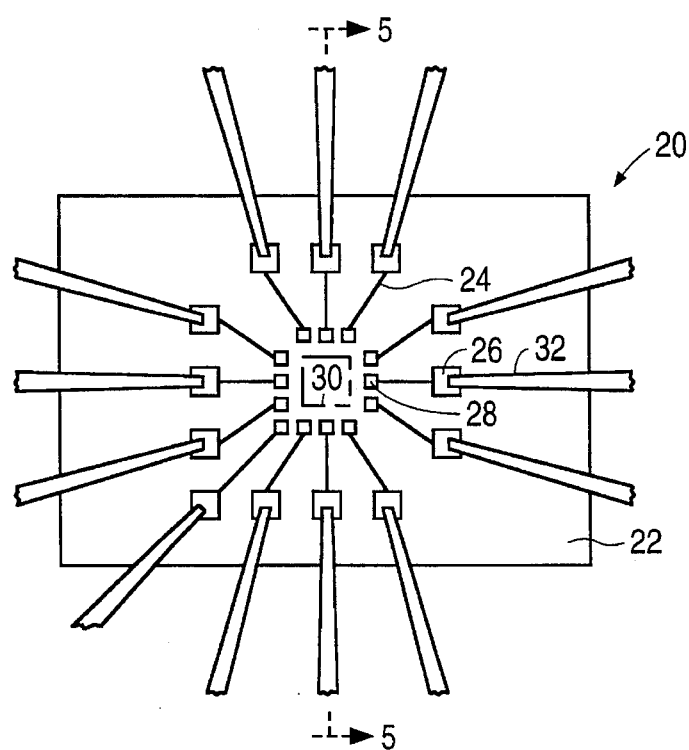
FIG. 6 is a top-down view of the interposer of FIG. 5 prior to a die being affixed to the interposer.

FIG. 6 is a top-down view of the structure of FIG. 5, where FIG. 5 is a cross-sectional view of the structure of FIG. 6 taken along line 5—5 in FIG. 6. At this time, the leadframe may be still part of a long leadframe strip, while the interposer 20 may also be on a long strip or previously separated out, whichever is deemed suitable for the manufacturing process used.

Figure 7:
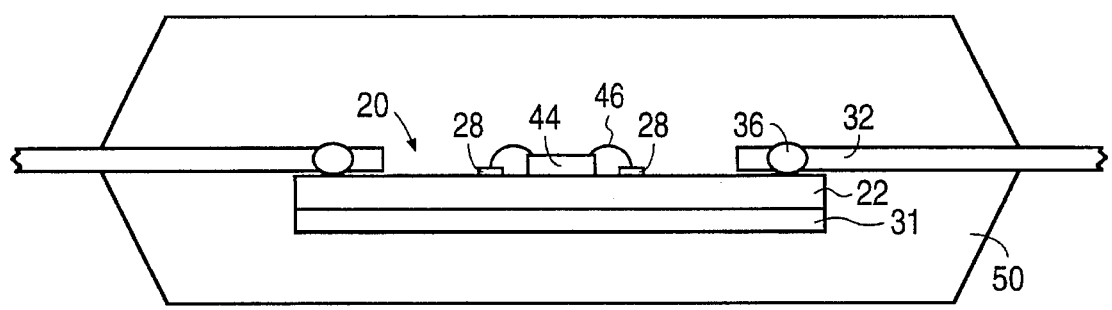
FIG. 7 is a cross-sectional view of a complete integrated circuit package showing the interposer connected between the leadframe and the wires bonded to the bonding pads of a die.

Next, using conventional tape automated placing/bonding equipment, a die 44 (FIG. 7) is adhesively secured to interposer 20 within dashed lines 30 in FIG. 6, and an automated wire tacker then bonds wires 46 to the die's bonding pads and the inner bonding pads 28. Wires 46 may be gold, aluminum, or any other conductor conventionally used.

The resulting structure is then encapsulated in plastic 50 using conventional techniques.

The interposer 20 can be made any size and may be standardized or customized for a particular configuration.

Figure 8:
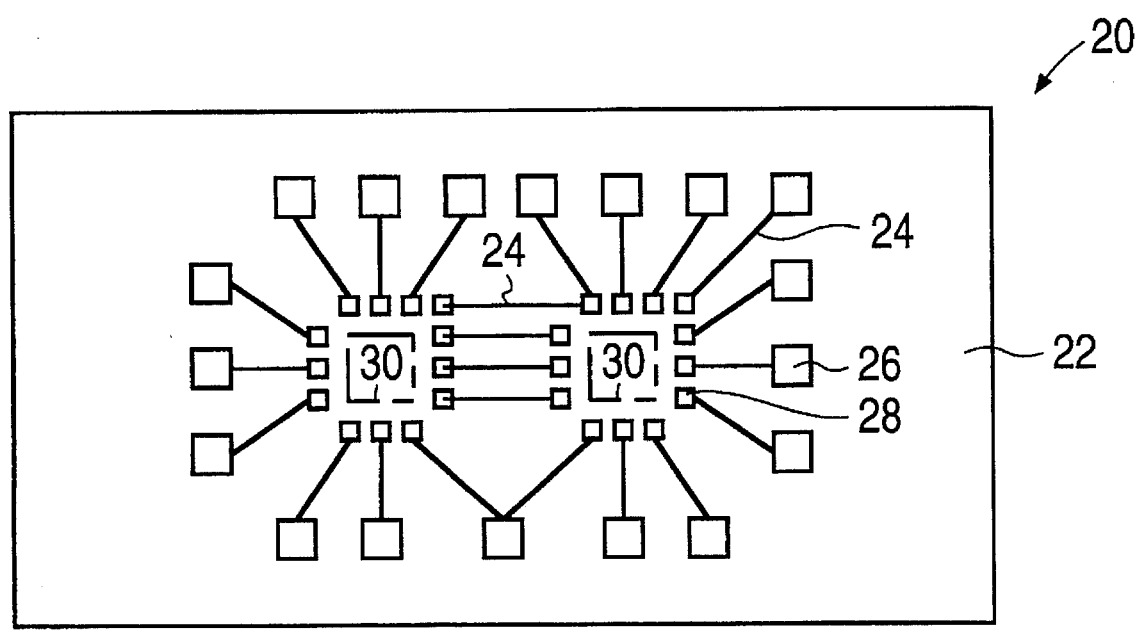
FIG. 8 is a top-down view of another interposer used for a hybrid circuit.

In one embodiment, shown in FIG. 8, the interposer 20 is designed for use in a hybrid circuit, where a plurality of integrated circuit chips are supported by interposer 20 and electrically connected to inner bonding pads 28. The interposer 20 then serves to electrically interconnect the various dies via traces 24 as well as provide an interface between the leadframe and the dies.

Using the present invention, the pitch of the inner bonding pads 28 can be made considerably less than 8 mils, such as 5 mils, which could not be achieved by leads of a leadframe. The pitch of the outer bonding pads 26 may now be virtually independent of the number of bonding pads on the die and the size of the die.

While particular embodiments of the present invention have been shown and described, it will be obvious to those skilled in the art that changes and modifications may be made without departing from this invention in its broader aspects and, therefore, the appended claims are to encompass within their scope all such changes and modifications that fall within the true spirit and scope of this invention.

What is claimed is:

1. An integrated circuit package comprising:

a conductive leadframe, said leadframe having leads terminating in lead tips generally converging toward a center of said leadframe and tapering as said lead tips extend toward said center of said leadframe, each of said lead tips being supported solely by its associated lead;

at least one integrated circuit die having terminal pads formed thereon;

an insulating substrate having a first set of bonding pads formed thereon, individual bonding pads in said first set of bonding pads being aligned with and directly connected to respective ones of said lead tips, said insulating substrate also having a second set of bonding pads formed thereon, said at least one die being affixed to said insulating substrate such that bonding pads in said second set of bonding pads are located proximate to said at least one die, individual ones of said bonding pads in said second set of bonding pads being electrically connected to respective ones of said terminal pads on said at least one die;

a plurality of conductors formed on said insulating substrate, individual ones of said conductors being connected between said bonding pads in said first set of bonding pads and said bonding pads in said second set of bonding pads so as to electrically connect said terminal pads of said at least one die to respective ones of said lead tips of said leadframe; and an insulating enclosure encapsulating said at least one integrated circuit die, said insulating substrate, and said lead tips.

2. The package of claim 1 further comprising:
wires having first ends connected to said terminal pads of said at least one die and having second ends connected to said bonding pads in said second set of bonding pads.

3. The package of claim 1 wherein said terminal pads of said at least one die oppose respective ones of said bonding pads in said second set of bonding pads and are electrically connected thereto.

4. The package of claim 1 wherein said conductors secured to said insulating substrate are conductive traces directly formed on said insulating substrate.

5. The package of claim 1 wherein said insulating substrate is a flexible tape.

6. The package of claim 1 wherein said second set of bonding pads substantially surrounds at least one die affixed to said insulating substrate.

7. The package of claim 1 wherein said enclosure is a plastic which has encapsulated said at least one die, said insulating substrate, and said lead tips in liquid form and has been cured to form said enclosure.

8. The package of claim 1 wherein a plurality of said bonding pads within said second set of bonding pads have a pitch of approximately 8 mils or less.

9. The package of claim 1 further comprising a support member connected to a surface of said insulating substrate.

10. The package of claim 1 wherein said lead tips are soldered to said bonding pads in said first set of bonding pads.

11. The package of claim 1 wherein said lead tips are electrically connected to bonding pads in said first set of bonding pads by a conductive adhesive.

12. The package of claim 11 wherein said conductive adhesive is a Z-adhesive which primarily conducts along a single axis between a bonding pad and an overlying lead tip.

13. The package of claim 1 wherein said insulating substrate is formed as a strip along with identical substrates and is separated into individual insulating substrates for each package.

* * * * *